(12) United States Patent
Fitzgerald et al.

(10) Patent No.: US 11,417,611 B2
(45) Date of Patent: Aug. 16, 2022

(54) DEVICES AND METHODS FOR REDUCING STRESS ON CIRCUIT COMPONENTS

(71) Applicant: Analog Devices International Unlimited Company, Limerick (IE)

(72) Inventors: Padraig Fitzgerald, Mallow (IE); George Redfield Spalding, Jr., Edinburgh (GB); Jonathan Ephraim David Hurwitz, Edinburgh (GB); Michael J. Flynn, Woodhaven (IE)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 16/801,093

(22) Filed: Feb. 25, 2020

(65) Prior Publication Data

US 2021/0265281 A1    Aug. 26, 2021

(51) Int. Cl.
| | |
|---|---|
| *H01L 23/00* | (2006.01) |
| *H01L 21/306* | (2006.01) |
| *H01L 21/8234* | (2006.01) |
| *H01L 23/528* | (2006.01) |
| *H01L 27/06* | (2006.01) |
| H01L 21/027 | (2006.01) |

(52) U.S. Cl.
CPC ...... *H01L 23/562* (2013.01); *H01L 21/30604* (2013.01); *H01L 21/8234* (2013.01); *H01L 23/528* (2013.01); *H01L 27/0629* (2013.01); H01L 21/0273 (2013.01)

(58) Field of Classification Search
CPC ............. H01L 23/562; H01L 21/30604; H01L 21/8204; H01L 23/528; H01L 27/629

USPC .................................. 257/506, 419; 438/53
See application file for complete search history.

(56) References Cited

U.S. PATENT DOCUMENTS

| | | | |
|---|---|---|---|
| 3,839,660 | A | 10/1974 | Stryker |
| 4,492,825 | A | 1/1985 | Brzezinski et al. |
| | | (Continued) | |

FOREIGN PATENT DOCUMENTS

| | | |
|---|---|---|
| DE | 10 2010 042 438 A1 | 7/2011 |
| DE | 10 2010 042 113 A1 | 4/2012 |
| | (Continued) | |

OTHER PUBLICATIONS

Final Office Action, U.S. Appl. No. 13/757,217, 10 pages, dated Feb. 27, 2015.

(Continued)

*Primary Examiner* — Thinh T Nguyen
(74) *Attorney, Agent, or Firm* — Wolf, Greenfield & Sacks, P.C.

(57) ABSTRACT

The present disclosure relates to integrated circuits which include various structural elements designed to reduce the impact of strain on the electronic components of the circuit. In particular, a combination of trenches and cavities are used to mechanically isolate the integrated circuit from the surrounding substrate. The trenches may be formed such that they surround the integrated circuit, and the cavities may be formed under the integrated circuit. As such, the integrated circuit may be formed on a portion of the substrate that forms a platform. In order that the platform does not move, it may be tethered to the surrounding substrate. By including such mechanical elements, variation in the electrical characteristics of the integrated circuit are reduced.

18 Claims, 14 Drawing Sheets

(56) References Cited

U.S. PATENT DOCUMENTS

| | | | |
|---|---|---|---|
| 4,524,247 A | 6/1985 | Lindenberger et al. |
| 4,533,795 A | 8/1985 | Baumhauer, Jr. et al. |
| 4,558,184 A | 12/1985 | Bch-Vishniac et al. |
| 4,710,744 A | 12/1987 | Wamstad |
| 4,740,410 A | 4/1988 | Muller et al. |
| 4,744,863 A | 5/1988 | Guckel et al. |
| 4,776,019 A | 10/1988 | Miyatake |
| 4,800,758 A | 1/1989 | Knecht et al. |
| 4,825,335 A | 4/1989 | Wilner |
| 4,853,669 A | 8/1989 | Guckel et al. |
| 4,872,047 A | 10/1989 | Fister et al. |
| 4,918,032 A | 4/1990 | Jain et al. |
| 4,948,757 A | 8/1990 | Jain et al. |
| 4,996,082 A | 2/1991 | Guckel et al. |
| 5,067,007 A | 11/1991 | Kanji et al. |
| 5,090,254 A | 2/1992 | Guckel et al. |
| 5,105,258 A | 4/1992 | Silvis et al. |
| 5,113,466 A | 5/1992 | Acarlar et al. |
| 5,146,435 A | 9/1992 | Bernstein |
| 5,172,213 A | 12/1992 | Zimmerman |
| 5,178,015 A | 1/1993 | Loeppert et al. |
| 5,188,983 A | 2/1993 | Guckel et al. |
| 5,207,102 A | 5/1993 | Takahashi et al. |
| 5,241,133 A | 8/1993 | Mullen, III et al. |
| 5,273,939 A | 12/1993 | Becker et al. |
| 5,303,210 A | 4/1994 | Bernstein |
| 5,314,572 A | 5/1994 | Core et al. |
| 5,315,155 A | 5/1994 | O'Donnelly et al. |
| 5,317,107 A | 5/1994 | Osorio |
| 5,336,928 A | 8/1994 | Neugebauer et al. |
| 5,452,268 A | 9/1995 | Bernstein |
| 5,468,999 A | 11/1995 | Lin et al. |
| 5,490,220 A | 2/1996 | Loeppert |
| 5,515,732 A | 5/1996 | Willcox et al. |
| 5,593,926 A | 1/1997 | Fujihira |
| 5,596,222 A | 1/1997 | Bernstein |
| 5,608,265 A | 3/1997 | Kitano et al. |
| 5,629,566 A | 5/1997 | Doi et al. |
| 5,633,552 A | 5/1997 | Lee et al. |
| 5,658,710 A | 8/1997 | Neukermans |
| 5,684,324 A | 11/1997 | Bernstein |
| 5,692,060 A | 11/1997 | Wickstrom |
| 5,740,261 A | 4/1998 | Loeppert et al. |
| 5,828,127 A | 10/1998 | Yamagata et al. |
| 5,870,482 A | 2/1999 | Loeppert et al. |
| 5,901,046 A | 5/1999 | Ohta et al. |
| 5,923,995 A | 7/1999 | Kao et al. |
| 5,939,633 A | 8/1999 | Judy |
| 5,945,605 A | 8/1999 | Julian et al. |
| 5,956,292 A | 9/1999 | Bernstein |
| 5,960,093 A | 9/1999 | Miller |
| 5,994,161 A | 11/1999 | Bitko et al. |
| 6,084,292 A | 7/2000 | Shinohara |
| 6,128,961 A | 10/2000 | Haronian |
| 6,147,397 A | 11/2000 | Burns et al. |
| 6,169,328 B1 | 1/2001 | Mitchell et al. |
| 6,243,474 B1 | 6/2001 | Tai et al. |
| 6,249,075 B1 | 6/2001 | Bishop et al. |
| 6,309,915 B1 | 10/2001 | Distefano |
| 6,329,706 B1 | 12/2001 | Nam |
| 6,384,472 B1 | 5/2002 | Huang |
| 6,384,473 B1 | 5/2002 | Peterson et al. |
| 6,401,545 B1 | 6/2002 | Monk et al. |
| 6,433,401 B1 | 8/2002 | Clark et al. |
| 6,505,511 B1 | 1/2003 | Geen et al. |
| 6,522,762 B1 | 2/2003 | Mullenborn et al. |
| 6,535,460 B2 | 3/2003 | Loeppert et al. |
| 6,548,895 B1 | 4/2003 | Benavides et al. |
| 6,552,469 B1 | 4/2003 | Pederson et al. |
| 6,617,683 B2 | 9/2003 | Lebonheur et al. |
| 6,667,189 B1 | 12/2003 | Wang et al. |
| 6,667,557 B2 | 12/2003 | Alcoe et al. |
| 6,677,176 B2 | 1/2004 | Wong et al. |
| 6,704,427 B2 | 3/2004 | Kearey |
| 6,711,317 B2 | 3/2004 | Jin et al. |
| 6,731,180 B1 | 5/2004 | Clark et al. |
| 6,732,588 B1 | 5/2004 | Mullenborn et al. |
| 6,741,709 B2 | 5/2004 | Kay et al. |
| 6,753,583 B2 | 6/2004 | Stoffel et al. |
| 6,768,196 B2 | 7/2004 | Harney et al. |
| 6,781,231 B2 | 8/2004 | Minervini |
| 6,812,620 B2 | 11/2004 | Scheeper et al. |
| 6,816,301 B1 | 11/2004 | Schiller |
| 6,821,819 B1 | 11/2004 | Benavides et al. |
| 6,829,131 B1 | 12/2004 | Loeb et al. |
| 6,847,090 B2 | 1/2005 | Loeppert |
| 6,857,312 B2 | 2/2005 | Choe et al. |
| 6,859,542 B2 | 2/2005 | Johannsen et al. |
| 6,914,992 B1 | 7/2005 | van Halteren et al. |
| 6,955,988 B2 | 10/2005 | Nevin et al. |
| 6,984,886 B2 | 1/2006 | Ahn et al. |
| 7,066,004 B1 | 6/2006 | Kohler |
| 7,088,032 B2 | 8/2006 | Oita et al. |
| 7,166,911 B2 | 1/2007 | Karpman et al. |
| 7,215,213 B2 | 5/2007 | Mescher et al. |
| 7,268,463 B2 | 9/2007 | Li et al. |
| 7,309,865 B2 | 12/2007 | Ikushima et al. |
| 7,551,048 B2 | 6/2009 | Iwata et al. |
| 7,839,052 B2 | 11/2010 | Wu et al. |
| 7,871,865 B2 | 1/2011 | Sengupta et al. |
| 7,920,770 B2 * | 4/2011 | Holzwarth et al. ..... G02B 6/122 385/129 |
| 8,049,326 B2 | 11/2011 | Najafi et al. |
| 8,103,027 B2 | 1/2012 | Zhang et al. |
| 8,217,474 B2 | 7/2012 | Lee et al. |
| 8,344,487 B2 | 1/2013 | Zhang et al. |
| 8,476,737 B2 | 7/2013 | Najafi et al. |
| 8,671,752 B2 | 3/2014 | Hoefer et al. |
| 8,698,292 B2 | 4/2014 | Najafi et al. |
| 8,906,730 B2 | 12/2014 | Graham et al. |
| 9,184,138 B2 | 11/2015 | Merassi et al. |
| 9,227,835 B2 | 1/2016 | Horning et al. |
| 9,422,156 B2 | 8/2016 | Smeys |
| 9,926,188 B2 | 3/2018 | Classen et al. |
| 10,131,538 B2 | 11/2018 | Kaanta et al. |
| 10,167,189 B2 | 1/2019 | Zhang et al. |
| 2001/0055836 A1 | 12/2001 | Kunda |
| 2002/0102004 A1 | 8/2002 | Minervini |
| 2002/0125559 A1 | 9/2002 | Mclellan |
| 2003/0016839 A1 | 1/2003 | Loeppert et al. |
| 2003/0133588 A1 | 7/2003 | Pedersen |
| 2003/0189222 A1 | 10/2003 | Itou et al. |
| 2004/0041254 A1 | 3/2004 | Long et al. |
| 2004/0056337 A1 | 3/2004 | Hasebe et al. |
| 2004/0070056 A1 | 4/2004 | Matsuzawa et al. |
| 2004/0179705 A1 | 9/2004 | Wang et al. |
| 2004/0184632 A1 | 9/2004 | Minervini |
| 2004/0184633 A1 | 9/2004 | Kay et al. |
| 2004/0262781 A1 | 12/2004 | Germain et al. |
| 2005/0005421 A1 | 1/2005 | Wang et al. |
| 2005/0018864 A1 | 1/2005 | Minervini |
| 2005/0089188 A1 | 4/2005 | Feng |
| 2005/0093117 A1 | 5/2005 | Masuda et al. |
| 2005/0178208 A1 | 8/2005 | Benzel et al. |
| 2006/0246630 A1 | 11/2006 | Sunohara et al. |
| 2007/0040231 A1 | 2/2007 | Harney et al. |
| 2007/0042521 A1 | 2/2007 | Yama |
| 2008/0290430 A1 | 11/2008 | Mahadevan et al. |
| 2011/0127623 A1 | 6/2011 | Fueldner et al. |
| 2011/0165717 A1 | 7/2011 | Lee et al. |
| 2012/0049298 A1 | 3/2012 | Schlarmann et al. |
| 2012/0068278 A1 | 3/2012 | Knipe et al. |
| 2012/0248552 A1 | 10/2012 | Benzel |
| 2012/0264250 A1 | 10/2012 | Graham et al. |
| 2013/0168840 A1 | 7/2013 | Merassi et al. |
| 2013/0292793 A1 | 11/2013 | Poucher et al. |
| 2014/0217521 A1 | 8/2014 | Johari-Galle et al. |
| 2014/0339656 A1 | 11/2014 | Schlarmann |
| 2014/0353772 A1 | 12/2014 | Stermer |
| 2015/0123256 A1 | 5/2015 | Kierse et al. |
| 2015/0197419 A1 | 7/2015 | Cheng et al. |
| 2016/0090297 A1 * | 3/2016 | Zhang et al. ... H01L 2224/4809 257/418 |
| 2016/0159641 A1 | 6/2016 | Najafi et al. |

(56) References Cited

U.S. PATENT DOCUMENTS

| | | |
|---|---|---|
| 2016/0229688 A1 | 8/2016 | Gu et al. |
| 2017/0073218 A1 | 3/2017 | Kaanta et al. |
| 2017/0122976 A1 | 5/2017 | Mitchell et al. |
| 2018/0148318 A1 | 5/2018 | Flynn et al. |
| 2018/0148325 A1* | 5/2018 | Duqi et al. .......... B81C 1/00238 |
| 2018/0230005 A1 | 8/2018 | Lee et al. |
| 2019/0047846 A1 | 2/2019 | Zhang et al. |
| 2020/0002159 A1 | 1/2020 | Theuss et al. |
| 2020/0283291 A1 | 9/2020 | Krishna et al. |

FOREIGN PATENT DOCUMENTS

| | | |
|---|---|---|
| DE | 10 2014 210 006 | 8/2015 |
| EP | 0 788 157 A2 | 6/1997 |
| JP | 60-077434 A | 5/1985 |
| JP | 62-241335 A | 10/1987 |
| JP | 05-226501 A | 9/1993 |
| JP | 07-142518 A | 6/1995 |
| JP | 08-116007 A | 5/1996 |
| WO | WO 83/01362 A1 | 4/1983 |
| WO | WO 91/05368 A1 | 4/1991 |
| WO | WO 01/20948 A2 | 3/2001 |
| WO | WO 02/45463 A2 | 6/2002 |
| WO | WO 2004/022477 A1 | 3/2004 |
| WO | WO 2005/036698 A2 | 4/2005 |
| WO | WO 2007/030345 A2 | 3/2007 |
| WO | WO 2012/037537 A2 | 3/2012 |
| WO | WO 2016/112463 A1 | 7/2016 |

OTHER PUBLICATIONS

Non Final Office Action, U.S. Appl. No. 13/757,217, 20 pages, dated Jul. 2, 2014 [2550/E20].
Office Action—U.S. Appl. No. 13/757,217, dated Jun. 27, 2016, 30 pages.
[No Author Listed], Department of Defense. Test Method Standard Microcircuits, FSC 5962, completed 1997.
[No Author Listed], Electret Condenser Microphone Cartridge Preamplifier, Maxim Integrated Products, Jul. 2002, 9 pages.
[No Author Listed], Liquid Crystal Polymer (LCP) Air Cavity Packages, Quantum Leap Packaging, Inc., Brochure, 2004, 2 pages.
[No Author Listed], Microphone industry to expand MEMS-based offerings, The Information Network, online <www.theinformationnet.com>, printed Feb. 1, 2005, Nov. 14, 2003, 2 pages.
[No Author Listed], Phone-Or/Technology, online <file://C:\Documents%20and% 20Settings\bmansfield\Local% 20Settings\Temporary%20-Internet%20Files\OLKE\Phone- Or% 20% . . . >, printed Feb. 1, 2005, 2 pages.
[No Author Listed], The Prismark Wireless Technology Report—Mar. 2005. Prismark Partners LLC; www.prismark.com, pp. 1-44.
Bajdechi et al., Single-Chip Low-Voltage Analog-to-Digital Interface for Encapsulation with Electret Microphone, The 11th International Conference on Solid-State Sensors and Actuators, Jun. 10-14, 2001, 4 pages.
Bernstein et al., High Sensitivity MEMS Ultrasound Arrays by Lateral Ferroelectric Polarization, Solid-State Sensor and Actuator Workshop, Jun. 4-8, 2000, 4 pages.
Bernstein, MEMS Air Acoustics Research the Charles Stark Draper Laboratory, PowerPoint Presentation, Aug. 1999, 8 pages.
Blackwell, The Electronic Packaging Handbook, CRC Press LLC, pp. 2-3, 7-1, 7-12, A-9, and A-11, 2000.
Brown, Advanced Electronic Packaging with Emphasis on Multichip Modules, Institute of Electrical and Electronics Engineers, Inc., pp. 4-8, 568, 1999.
Chen et al., Single-Chip Condenser Miniature Microphone with a High Sensitive Circular Corrugated Diaphragm, IEEE, 2002, 4 pages.
Cunningham et al., Wide bandwidth silicon nitride membrane microphones, SPIE vol. 3223, Sep. 1997, 9 pages.

Fan et al., Development of Artificial Lateral-Line Flow Sensors, Solid-State Sensor, Actuator and Microsystems Workshop, Jun. 2-6, 2002, 4 pages.
Fuldner et al., Silicon Microphones with Low Stress Membranes, The 11th International Conference on Solid-State Sensors and Actuators, Jun. 10-14, 2001, 4 pages.
Gale et al., MEMS Packaging, University of Utah, Microsystems Principles, PowerPoint Presentation, Oct. 11, 2001, 8 pages.
Hall et al., Self-Calibrating Micromachined Microphones with Integrated Optical Displacement Detection, The 11th International Conference on Solid State Sensors and Actuators, Jun. 10-14, 2001, 4 pages.
Harper (Editor-in-Chief), Electronic Packaging and Interconnection Handbook, Third Edition, McGraw-Hill, Chapter 7, Section 7.2.3.1, 2000, 7 pages.
Heuberger, Mikromechanik, Springer Verlang A.G., pp. 470-476, 1989 (With translation).
Hsieh et al., A Micromachined Thin-film Teflon Electret Microphone, Department of Electrical Engineering California Institute of Technology, 1997, 4 pages.
Judy, "Microelectromechanical systems (MEMS): fabrication, design and applications", Electrical Engineering Department, Institute of Physics Publishing, Smart Materials and Structures, vol. 10, pp. 1115-1134 Nov. 26, 2001.
Kabir et al., High Sensitivity Acoustic Transducers with Thin P+ Membranes and Gold Back-Plate, Sensors and Actuators, vol. 78, Issue 2-3, Dec. 17, 1999, 17 pages.
Ko et al., Piezoelectric Membrane Acoustic Devices, IEEE, 2002, 4 pages.
Kopola et al., MEMS Sensor Packaging Using LTCC Substrate Technology, VTT Electronics, Proceedings of SPIE vol. 4592, 2001, pp. 148-158.
Ma et al., Design and Fabrication of an Integrated Programmable Floating-Gate Microphone, IEEE, 2002, 4 pages.
Mason, Companies Compete to Be Heard on the Increasingly Noisy MEMS Phone Market, Small Times: News about MEMS, Nanotechnology and Microsystems, Jul. 18, 2003, 4 pages.
Neumann et al., A Fully-Integrated CMOS-MEMS Audio Microphone, The 12th International Conference on Solid State Sensors, Actuators and Microsystems Jun. 8-12, 2003, 4 pages.
Ono et al., Design and Experiments of Bio-mimicry Sound Source Localization Sensor with Gimbal-Supported Circular Diaphragm, The 12th International Conference on Solid State Sensors, Actuators and Microsystems, Jun. 8-12, 2003, 4 pages.
Pecht, Handbook of Electronic Package Design, Marcel Dekker, Inc. pp. 173, 179, 196, 210, 736, 744, 821 and 832, 1991.
Pedersen et al., A Polymer Condenser Microphone on Silicon with On-Chip CMOS Amplifier, Solid State Sensors and Actuators, 1997, 3 pages.
Rugg et al., Thermal Package Enhancement Improves Hard Disk Drive Data Transfer Performance, Pan Pacific Microelectronics Symposium, Proceedings of the Technical Program, Island of Maui, Hawaii, Feb. 5-7, 2002, pp. 451-456.
Schafer et al., Micromachined Condenser Microphone for Hearing Aid Use, Solid-State Sensor and Actuator Workshop, Jun. 8-11, 1998, 4 pages.
Sheplak et al., A Wafer-Bonded, Silicon-Nitride Membrane Microphone with Dielectrically-Isolated, Single-Crystal Silicon Piezoresistors, Solid-State Sensor and Actuator Workshop, Jun. 8-11, 1998, 4 pages.
Stahl et al., Thin Film Encapsulation of Acceleration Sensors Using Polysilicon Sacrificial Layer, Transducers '03, The 12th International Conference on Solid State Sensors, Actuators and Microsystems, Jun. 8-12, 2003, 4 pages.
Tilmans et al., The indent reflow sealing (IRS) technique—a method for the fabrication of sealed cavities for MEMS devices. IEEE Journal of Microelectro-mechanical Systems. 2000; 9(2):206-217.
Tummula et al., Microelectronics Packaging Handbook, Semiconductor Packaging Part II, Second Edition, Chapman & Hall, pp. 11-12, 1997.
Weigold et al., A Mems Condenser Microphone for Consumer Applications, Analog Devices, Inc. and Pixtronix, Inc., Jan. 2006, 4 pages.

(56) References Cited

OTHER PUBLICATIONS

Yovcheva et al., Investigation on Surface Potential Decay in PP Corona Electrets, BPU-5: Fifth General Conference of the Balkan Physical Union, Aug. 25-29, 2003, 4 pages.
Zou et al., A Novel Integrated Silicon Capacitive Microphone—Floating Electrode "Electret" Microphone (FEEM), Journal of Microelectromechanical Systems, vol. 7, No. 2, Jun. 1998, 11 pages.
Extended European Search Report dated Jul. 16, 2021 in connection with European Application No. 21154783.1.
Kilchytska et al., Silicon-on-Nothing MOSFETs: An efficient solution for parasitic substrate coupling suppression in SOI devices. Applied Surface Science. Jul. 30, 2008; 254(19): 6168-6173.

\* cited by examiner

DEVICES AND METHODS FOR REDUCING STRESS ON CIRCUIT COMPONENTS

FIELD OF THE DISCLOSURE

The present application relates to devices and methods for reducing stress on circuit components.

BACKGROUND

Integrated circuits ("IC") typically encounter mechanical strain as a result of differences in physical properties of different materials which constitute an IC package. The materials include semiconductor materials, oxide materials, metals, and various plastics to encapsulate the IC. These materials have different temperature coefficients of expansion ("TCE"), hygroscopicity and viscoelasticity, which apply mechanical strains to the IC over variations in temperature, humidity, and time.

The mechanical strain can cause changes in the electrical characteristics of circuit components within an IC. During manufacture, calibration can be performed in an attempt to minimize the effects of mechanical strain on the electrical characteristics. After manufacture, however, an IC is still subject to changes due to temperature, humidity, and time. Further, external forces on an IC package will impact strain on the IC. For example, external forces may be applied to the IC by mechanical handlers during testing of the IC.

The applicant's prior publication, US2013/0292793, proposes the use of trenches around an IC in order to isolate the IC from mechanical strain in the surrounding substrate. However, there is a need in the art for improved techniques to minimize changes in electrical characteristics for electrically sensitive circuit components within an IC package due to strain.

SUMMARY OF THE DISCLOSURE

The present disclosure relates to integrated circuits which include various structural elements designed to reduce the impact of strain on the electronic components of the circuit. In particular, a combination of trenches and cavities are used to mechanically isolate the integrated circuit from the surrounding substrate. The trenches may be formed such that they surround the integrated circuit, and the cavities may be formed under the integrated circuit. As such, the integrated circuit may be formed on a portion of the substrate that forms a platform. In order that the platform does not move, it may be tethered to the surrounding substrate. By including such mechanical elements, stress and strain transmission to the sensitive circuits is minimised, and variation in the electrical characteristics of the integrated circuit are reduced.

In a first aspect, the present disclosure provides an integrated circuit, comprising: an integrated circuit die having one or more stress-sensitive circuit components formed on or adjacent to a first surface of the integrated circuit die; one or more trenches formed around the stress-sensitive circuit components; and one or more cavities, formed underneath the stress-sensitive circuit components.

In a second aspect, the present disclosure provides a method of manufacturing an integrated circuit, the method comprising: providing an integrated circuit die; forming one or more stress-sensitive circuit components on or adjacent a first surface of the integrated circuit die; forming one or more trenches around the one or more components; forming a cavity underneath the one or more stress-sensitive components.

In a third aspect, the present disclosure provides a method of manufacturing an integrated circuit, the method comprising: providing a wafer having a cavity formed in a first surface thereof; bonding an integrated circuit die to the first surface; forming one or more trenches in a first surface of the integrated circuit die; wherein one or more stress-sensitive components are formed on or adjacent the first surface of the integrated circuit die, within a region formed by the one or more trenches.

Further embodiments and features of the disclosure are defined in the accompanying claims.

BRIEF DESCRIPTION OF THE DRAWINGS

The present disclosure will now be described, by way of example only, in connection with the accompanying drawings, in which.

DETAILED DESCRIPTION

Figure 1:
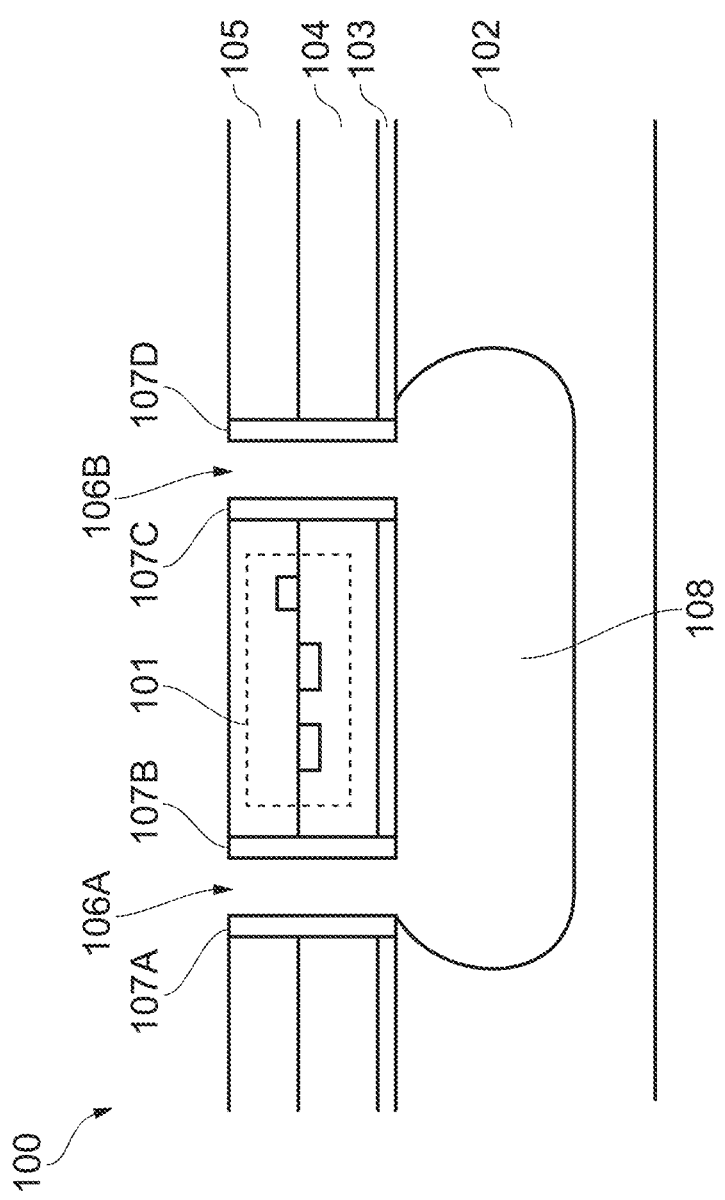
FIG. 1 is a cross-section through an integrated circuit in accordance with an embodiment of the disclosure.

The present disclosure relates to various mechanisms for reducing mechanical stresses experienced by integrated circuits. Integrated circuits are generally formed using silicon wafers. Active circuit components, such as transistors, are formed in a layer of semiconductor, such as silicon, by doping the semiconductor with impurities. Connections to active components may be made using layers of metallisation formed in dielectric layers, such as silicon oxide, formed over the silicon. Some integrated circuits are sensitive to external influences, such as temperature and mechanical stress. When temperature or mechanical stress is varied, the electrical characteristics of such circuits are also changed, and this can result in changes in the output of a circuit, for a given input. It is a generally recognised desire in electronic circuits to reduce the impact of such external influences. For example, it is particularly important for certain circuits such as voltage or current references that the output does not vary significantly from the desired output. If a voltage reference is required to provide a one volt output, it is desired that the output is always one volt, regardless of temperature or mechanical stress.

There are various different forms of mechanical stress which can have an impact on the output of sensitive circuitry. For example, when individual integrated circuits are cut out of the silicon wafer on which they were produced, the cutting process can result in changes to the characteristics of the circuit. This makes it difficult, if not impossible, to calibrate the circuit once on the wafer, because of changes that occur during the cutting process. Additionally, the die packaging process, the printed circuit board mounting process, moisture ingress into the IC, temperature change, or externally induced mechanical strain can, cause the die stress to change, thereby affecting the output of the integrated circuit.

The applicant has previously recognised some of these issues, as described in US patent publication no. US 2013/0292793A1. In this disclosure, it was proposed to provide trenches through the dielectric and silicon layers to isolate the sensitive integrated circuits from stresses in the surrounding semiconductor. While trenches have helped with mitigating the impact of mechanical stress, the applicant has worked on further improvements to create even better mechanical isolation. In particular, the present disclosure relates to the provision of one or more cavities in the space beneath the sensitive integrated circuit. The cavities may be produced by forming trenches around the sensitive integrated circuit, in a manner similar to that described in US 2013/0292793A1, and then using the trenches to perform an isotropic or anisotropic etch of the silicon beneath the integrated circuit. As will be appreciated, rather than a single trench encompassing the integrated circuit, one or more trenches partially surrounding the integrated circuit may be used. By selectively, isotropically etching under the integrated circuit, the portion of the semiconductor on which the integrated circuit is formed effectively floats above the remaining silicon, and is coupled to the silicon by one or more tethers. By completely undercutting the integrated circuit, leaving only minimal tether material between the integrated circuit and the silicon, isolation from mechanical stress is significantly improved. Various examples of mechanically isolated circuits and methods of manufacture thereof will now be described.

The trenches may be formed around the integrated circuit, so that is shielded on one or more sides, from strain in the substrate. For example, the trench may be formed to shield the integrated circuit on all sides, such that the integrated circuit is located on a platform. However, tethers may be formed between the platform and the surround substrate, to support the platform, and to provide conduits along which electrical connections can be made.

Using the trenches as a path to a point beneath the platform, cavities may be formed underneath the platform using an isotropic etch. A single cavity may be formed, to completely undercut the platform. Alternatively, multiple cavities may be formed, which do not completely undercut the platform. For example, a pedestal may be formed underneath, and central to the platform, in order to provide support to the platform.

By utilising a combination of trenches and cavities, significant improvements in mechanical strain isolation may be realised. The use of pedestals and tethers provides sufficient support to the integrated circuit platform, while the tethers also provide conduits for electrical conductors to couple the circuits to external connections.

The present disclosure is particular suitable for use with active circuits which include a number of active components which may be susceptible to variations in their characteristics. For example, active circuits may include circuits which utilise combinations of bipolar junction transistors, field-effect transistors, and operational amplifiers. They may include amplifier circuits, power management circuits, references, converters, or isolators, amongst many other well-known circuits.

The present disclosure may be used with various different semiconductor fabrication processes. For example, it may be utilised with CMOS and bipolar junction transistor fabrication processes. However, the present disclosure finds particular application with BiCMOS fabrication processes. BiCMOS devices, which combine BJTs and CMOS devices on the same IC, are particularly sensitive to changes in device parameters. As such, mechanical isolation may play a particularly important role with BiCMOS circuits.

FIG. 1 shows an integrated circuit 100. The integrated circuit 100 may include circuit components 101. The circuit components 101 may, for example, be the components of a reference circuit. The components 101 may be connected to other circuit components via metallic traces, which are not shown. The integrated circuit 100 may be formed from a silicon on insulator (SOI) wafer. That is, a semiconductor wafer including a base layer of handle silicon, a layer of device silicon, with a layer of insulating oxide formed therebetween. SOI wafers are increasingly common in integrated circuit design, and are particularly useful for the present disclosure. As shown in FIG. 1, there is a layer of handle silicon 102, and a layer of oxide 103 formed over the handle silicon 102. The oxide layer 103 is a dielectric insulator and may for example be silicon oxide. A layer of device silicon 104 is formed over the oxide layer 103. A further layer of oxide 105 is formed over the device silicon 104. The oxide layer 104 may include multiple layers of oxide and metallisation, and may include the interlayer dielectric (ILD) and the inter-metal dielectric (IMD). The components 101 of the integrated circuit 100 may be formed in the device silicon layer 104 and the oxide layer 105. The manner in which the components 101 are formed will be familiar to the person skilled in the art, and will not be described here in any further detail.

Trenches 106A and 106B are formed either side of the circuit components 101 using a deep silicon etch. Further details of the processing steps will be described below. In this example, two trenches are shown which do not circumscribe the circuit components, but are instead separate from each other. It will be appreciated that various different combinations of the number of trenches, the shape of the trenches and proximity of trenches may be provided, and this will be described in more detail below. The trenches 106A, 106B are each provided with sidewall protection 107A, 107B, 107C and 107D. The sidewall protection may be an oxide layer which is deposited after formation of the trenches. The integrated circuit 100 is also provided with a cavity 108. As can be seen in FIG. 1, the trenches reach as far as the oxide layer 103. The cavity is formed in the space beneath the circuit components 101 in the handle silicon layer 102. In this example, the cavity is formed after formation of the trenches using an isotropic etch. Further details of this will be described below. Although not shown, the circuit components 101 are tethered to the remainder of the integrated circuit 100 via tethers which are formed by the areas between the trenches. The portion of the integrated circuit 100 on which the components 101 are formed may be regarded as a stress isolation table 109. Because the table 109 is isolated from the handle silicon 102 as well as being isolated from the surrounding layers of device silicon and oxide by the trenches 106A and 106B, the components 101 are susceptible to significantly less mechanical stress than the prior art devices described above.

The process of manufacturing the integrated circuit 100 shown in FIG. 1 will now be described with reference to FIG. 2 and FIG. 3.

Figure 2A:
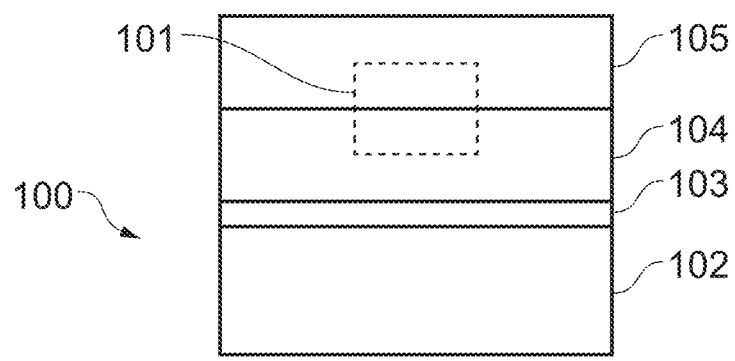
FIGS. 2A to 2E are cross-sections through the integrated circuit of FIG. 1, showing various steps in the manufacturing process.
Figure 2B:
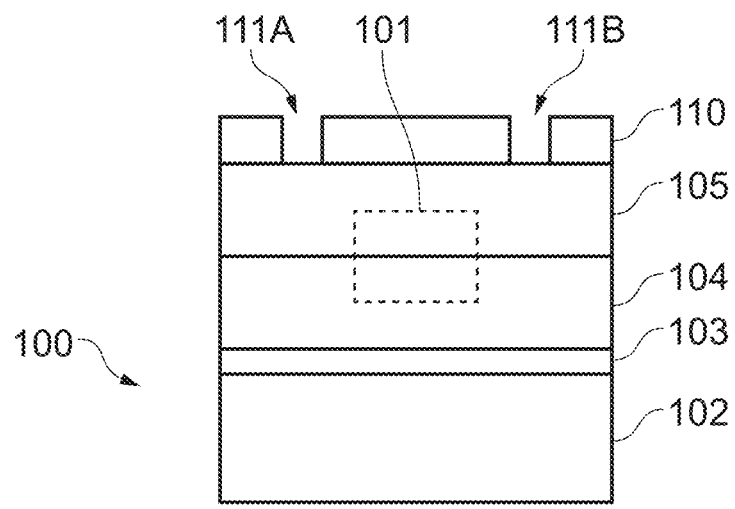
Figure 2C:
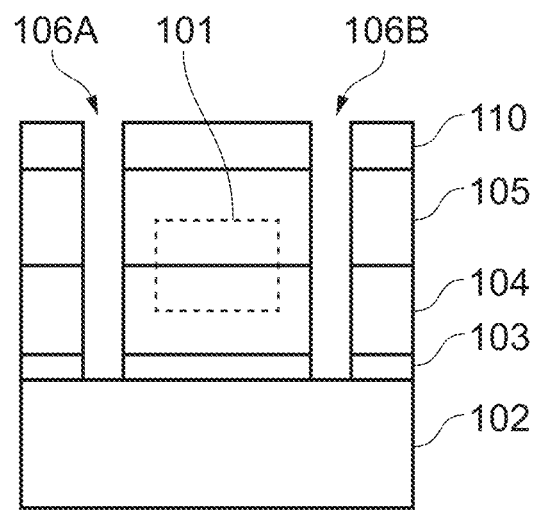
Figure 2D:
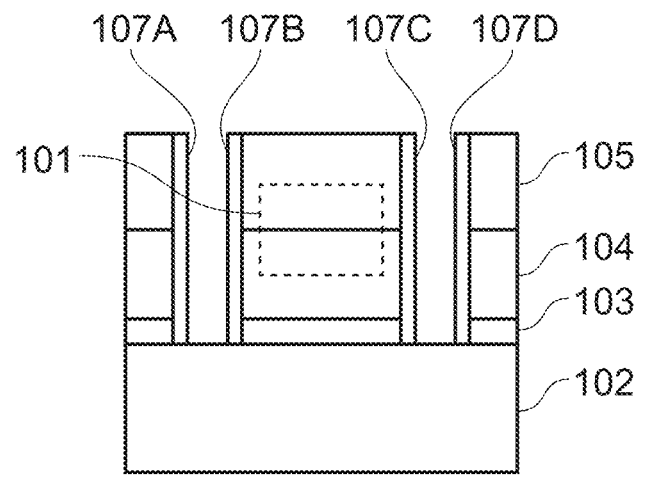
Figure 2E:
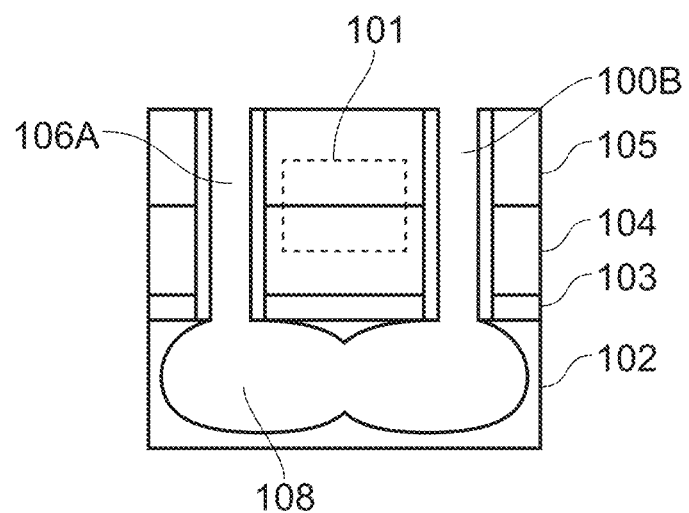
Figure 3:
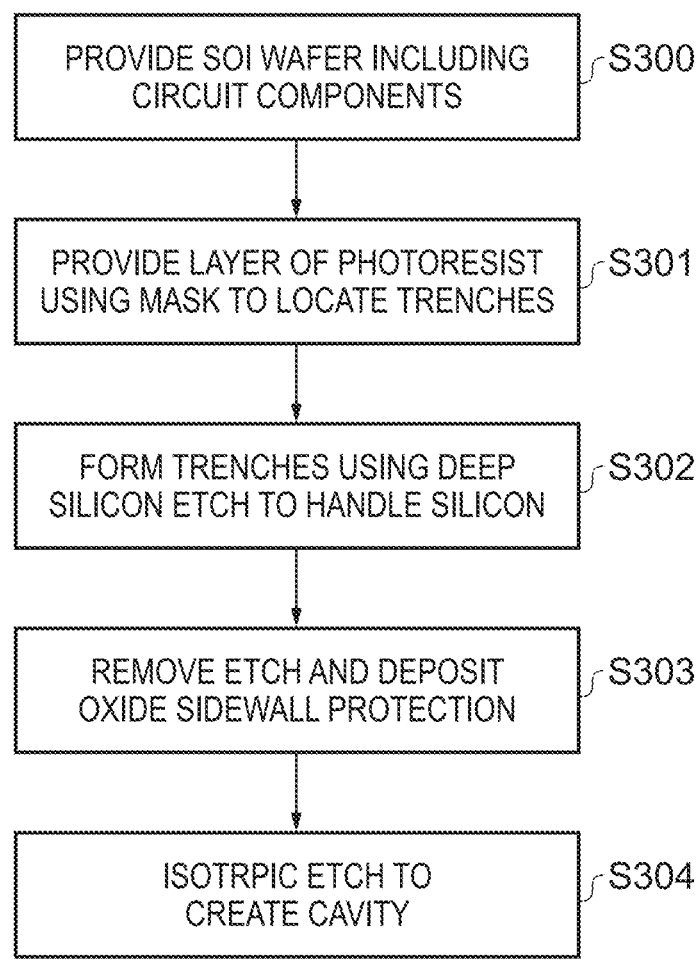
FIG. 3 is a flow chart showing the manufacturing process of FIGS. 2A to 2E.

FIG. 2A shows the integrated circuit 100 in the first step in the process in which the SOI wafer including the circuit components 101 is provided (S300). At this stage in the process, the integrated circuit 100 is the same as any other integrated circuit absent the mechanical stress isolation aspects of the present disclosure. As shown in FIG. 2B, a layer of photoresist 110 is provided over the oxide layer 105 using a mask, in order to expose the areas where the trenches will be created (S301). As can be seen in FIG. 2B, there are two openings 111A and 111B. The trenches are then formed using a deep silicon etch to cut down as far as the handle silicon 102 (S302).

The photoresist layer 110 is then removed and the trenches 106A, 106B are lined with sidewall protection, which may be done by depositing and oxide layer on the sidewalls of the trenches (S303). As can be seen, the sidewall protection 107A, 107B, 107C and 107D is formed on the walls of the trenches 106A and 106B.

Once the sidewall protection is in place, the cavity etching can begin. This is done using a controlled isotropic etch via both trenches 106A and 106B (S304). Etching in this manner effectively creates two cavities in each trench, and as the cavities increase in size, they join in the middle to undercut the circuit components 101.

One of the problems with forming trenches close to active circuit components, such as transistors, is that leakage currents can propagate through the trench walls. The trench walls are protected using a layer of passivation in order to reduce leakage currents.

It will be appreciated that the above-described process may begin with a non-SOI wafer, and that the various layers of silicon and oxide may be fabricated using well-established fabrication techniques.

Figure 4:
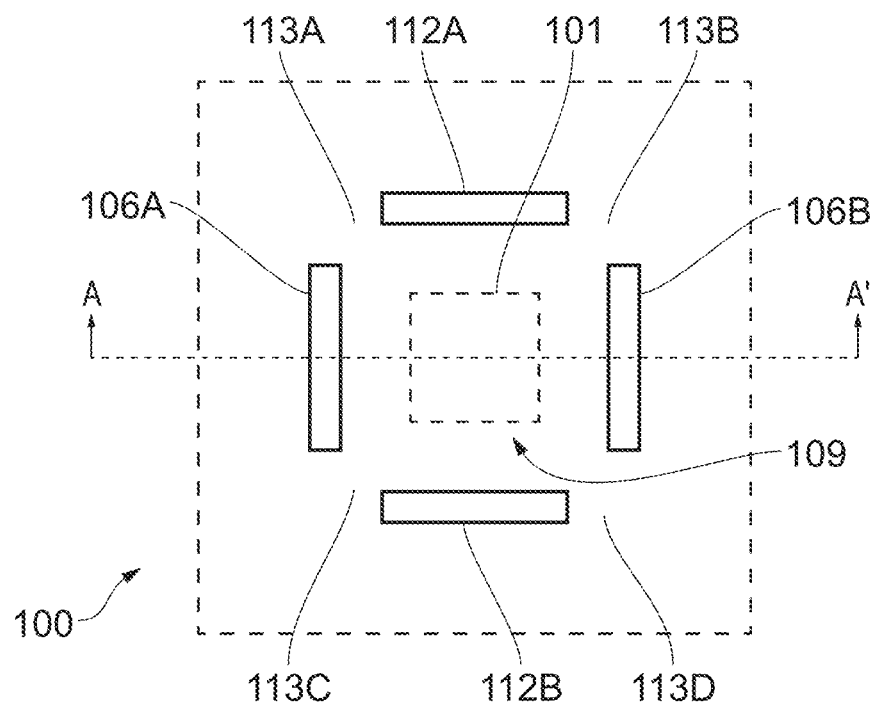
FIG. 4 is a plan view of an integrated circuit in accordance with an embodiment of the disclosure.

FIG. 4 is a plan view of the integrated circuit 100 shown in FIG. 1. The cross section shown in FIG. 1 is identified by hashed line AA-. As can be seen in FIG. 4, trenches 106A and 106B are shown. Between these trenches lies the circuit components 101. Additionally, trenches 112A and 112B are also shown. These are not identified in FIG. 1 as they are not present in cross section AA-. Trenches 112A and 112B may be identical to trenches 106A and 106B in size and shape, however they are oriented orthogonally to trenches 106A and 106B. These trenches may also be used to form the cavity 108 (not shown in FIG. 4) and therefore extend down to the cavity 108. The trenches 106A, 106B, 112A and 112B define the perimeter of the table 109. The table 109 is physically coupled to the surrounding structure by tethers 113A to 113D. The pattern of trenches and tethers is formed by the mask during the photoresist stage of the manufacturing process.

The above described integrated circuit 100 isolates the circuit components 101 from mechanical stresses experienced by the surrounding structure extremely well. Because the only physical coupling between the table 109 and the surrounding structure is via the tethers 113A to 113D, the physical connections by which mechanical stresses can be transmitted from the surrounding structure to the table 109 are minimised.

The present disclosure also provides a number of alternative arrangements of trenches and tethers which are considered to be particularly good at isolating the platform 109 from mechanical stress.

Figure 5:
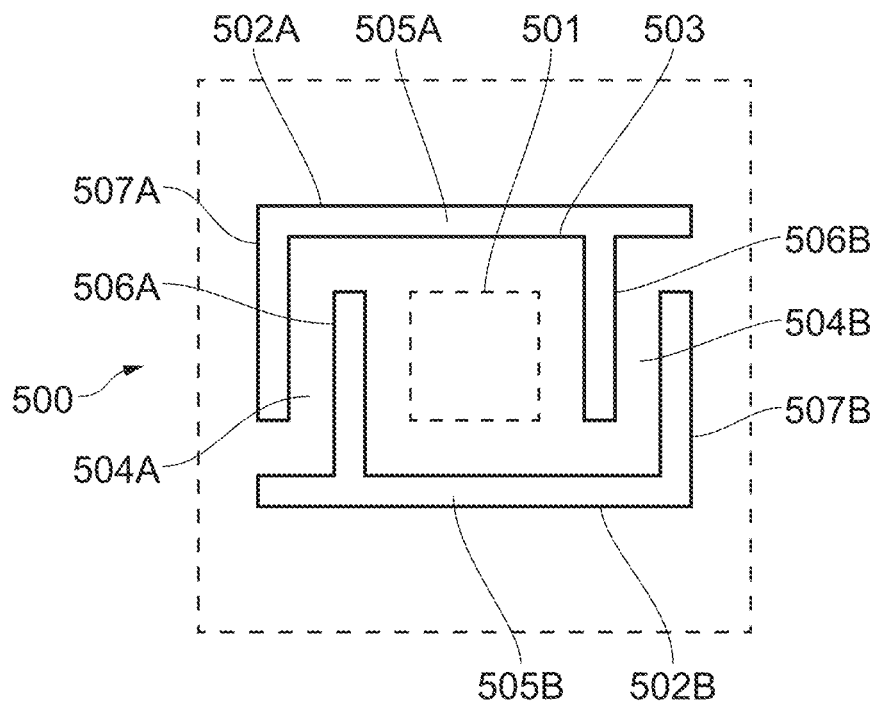
FIG. 5 is a plan view of an integrated circuit in accordance with an embodiment of the disclosure.

FIG. 5 shows an arrangement which minimises the number of tethers to two. By using two tethers, the tethering elements can be made weak enough to transmit minimal stress to the table, but strong enough to mechanically support the table. FIG. 5 shows an integrated circuit 500 which includes circuit components 501. In this example, two trenches 502A and 502B are formed in such a way that table 503 is coupled to the surrounding structure by two tethers 504A and 504B. The tethers are both S-shaped, each coupling a respective corner of the table 503 to a point on the surrounding structure near an adjacent corner of the table 503. Each of the trenches includes a first portion 505A and 505B which run alongside and define opposing sides of the table 503. Each trench includes a further portion 506A, 506B which run alongside and define orthogonal and opposing sides of the table 503. The portions 506A, 506B are coupled to respective portions 505A and 505B such that each trench surrounds two adjoining sides of the table 503 in an L-shape. Each trench further includes portions 507A, 507B which are joined to each respective trench at opposing ends of the portions 505A, 505B to the portions 506A and 506B. Portions 507A, 507B are parallel to sections 506A, 506B and orthogonal to sections 505A and 505B and further define the S-shape tethers 504A and 504B. This arrangement provides advantages in terms of isolating the table 503 from the surrounding structure.

Figure 6:
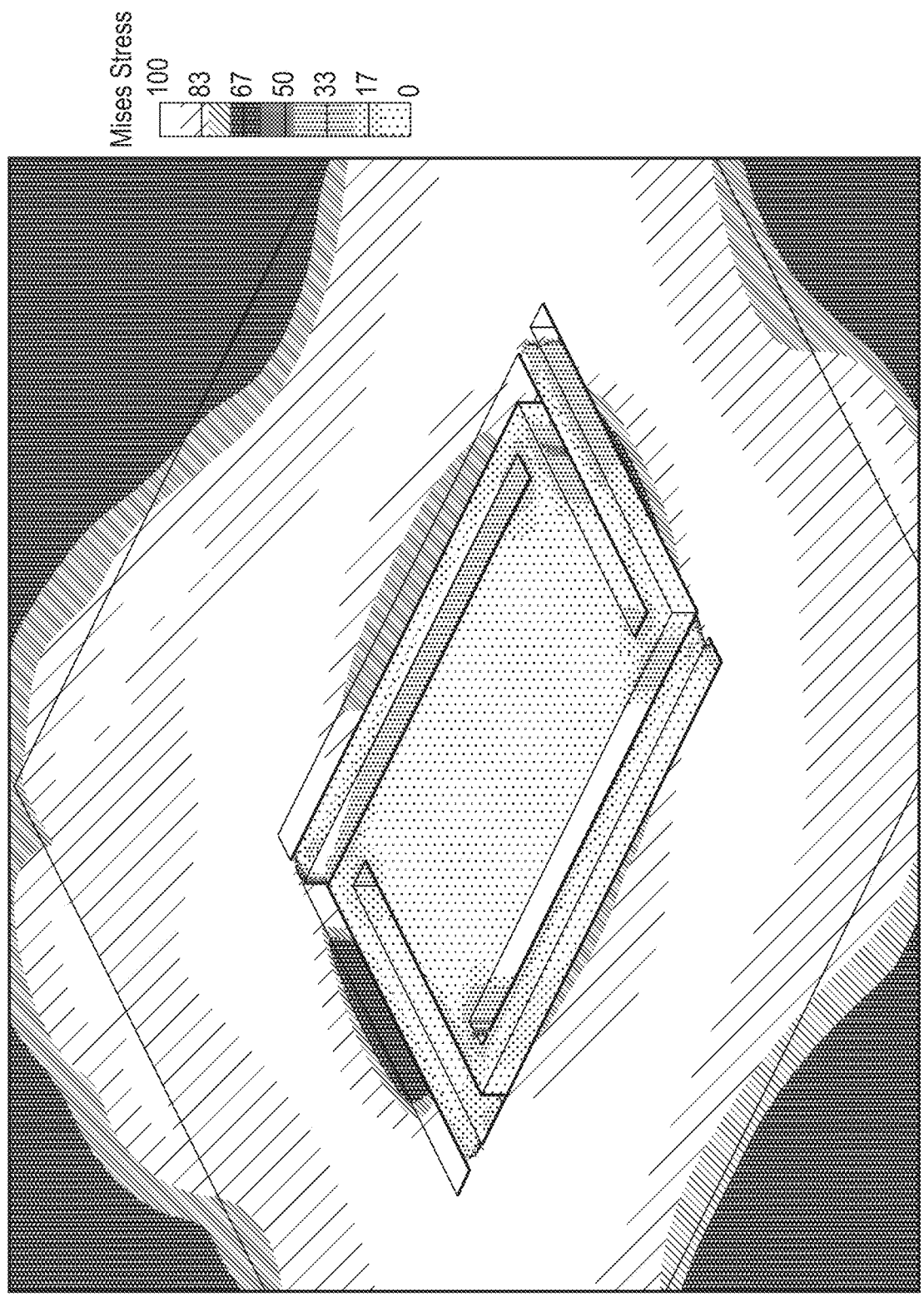
FIG. 6 is a simulation showing the stress experienced by the integrated circuit of FIG. 5.

FIG. 6 is a simulation showing the mechanical stress experienced by an integrated circuit, having a tethered table. This arrangement is similar to that shown in FIG. 8A below. The simulation shows the area surrounding the table under significant mechanical stress. This is shown in white. Although certain areas of the surrounding structure and the tethers experience stress, the majority of the table itself does not experience significant stress. As such, the table is suitable for housing components which have stress-dependent characteristics.

Figure 7:
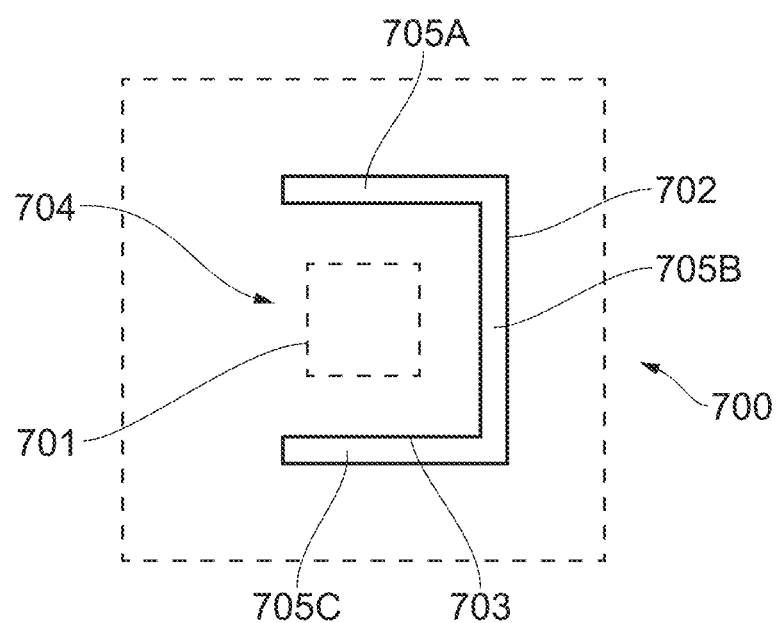
FIG. 7 is a plan view of an integrated circuit in accordance with an embodiment of the disclosure.

FIG. 7 shows an example of an integrated circuit 700 including circuit components 701. In this example, a single trench 702 is provided on three sides of the table 703. A single tether 704 extended down one side of the table 703 is provided. The trench 702 includes portion 705A, 705B, 705C. Portion 705B is from opposite the tether 704 with portion 705A and 705C being formed parallel with each other, and orthogonal to portion 705B. This arrangement creates a cantilever for reverse C-shape trench.

Figure 8A:
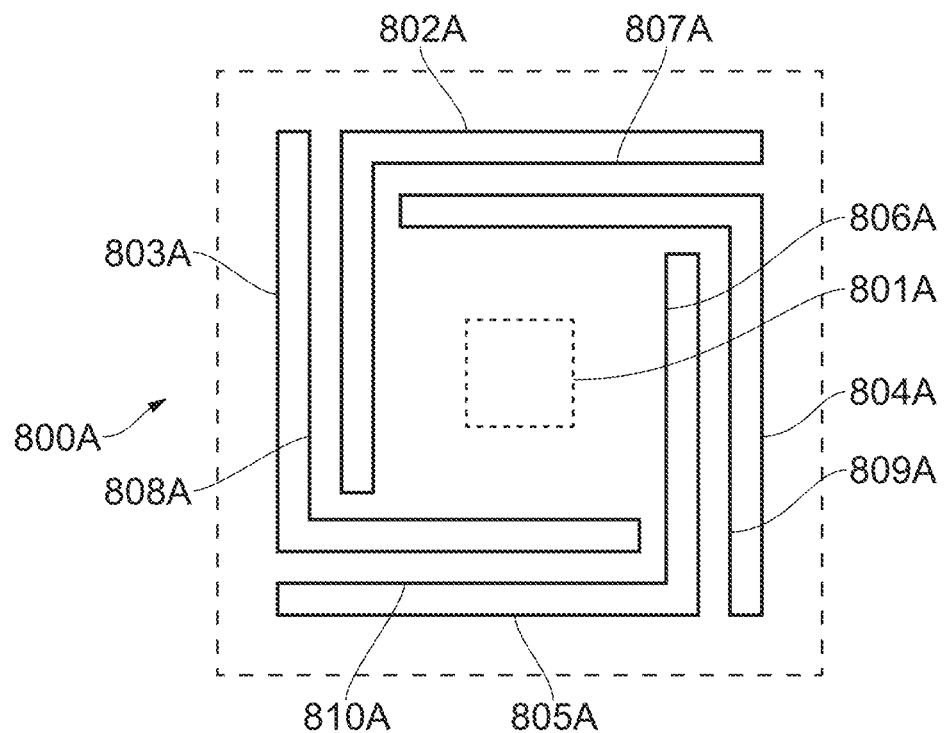
FIGS. 8A to 8F are plan views of an integrated circuit in accordance with further embodiments of the disclosure.

FIGS. 8A to 8F show various other examples of the arrangement of the integrated circuit, the platform and tethers. FIG. 8A shows an integrated circuit 800A, which is similar to integrated circuit 500, except that it includes four tethers, rather than two. The integrated circuit 800A includes circuit components 801A. In this example, four trenches 802A, 803A, 804A and 805A are formed in such a way that table 806A is coupled to the surrounding structure by four tethers 807A, 808A, 809A and 810A. The tethers, and their respective trenches are L-shaped. Each tether couples a respective corner of the table 806A to a point on the surrounding structure near an adjacent corner of the table 806A. Each of the trenches extends along two adjoining sides of the table 806A. This arrangement further isolates the table 806A from mechanical stresses in the surrounding structure.

Figure 8B:
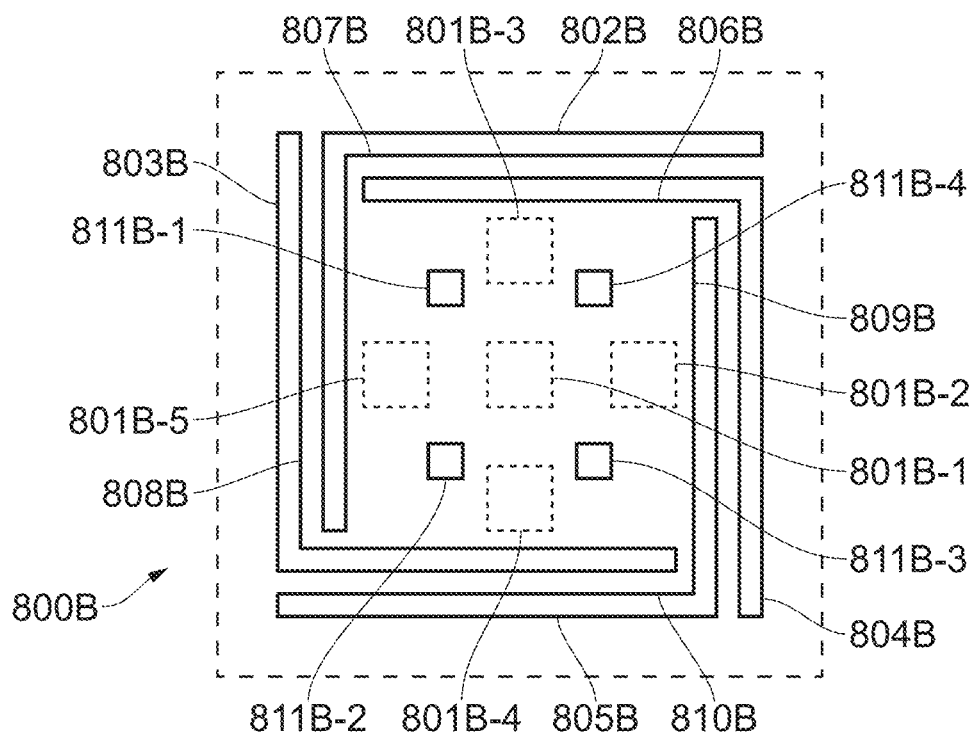

FIG. 8B shows a further example of an integrated circuit 800B. In this example, the table is similar in several respects to the one shown in FIG. 8A. Common components will be denoted with the same reference numeral, will include a 'B' suffix rather than an 'A' suffix. In addition to the features shown in FIG. 8A, the integrated circuit 800B includes five groups of components, denoted by numerals 801B-1 to 801B-5. In between these groups of components are four openings, or trenches, 811B-1 to 811B-4. This arrangement enables more than one group of components to be formed on a table, with the openings 811B-1 to 811B-1 acting further reduce the effects of stress on each group. It will be appreciate that different numbers and arrangements of openings and groups of components may be implemented, depending on the size of the table 806B.

Figure 8C:
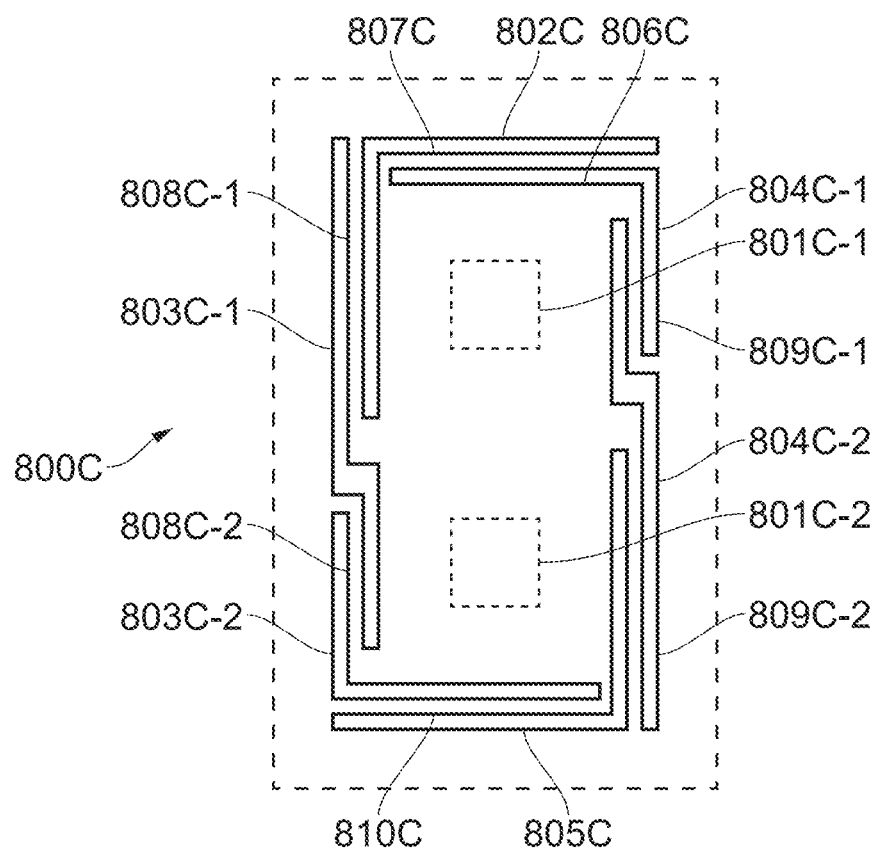

FIG. 8C shows a further example of an integrated circuit 800C. In this example, the table is similar in several respects to the one shown in FIG. 8A. Common components will be denoted with the same reference numeral, will include a 'C' suffix rather than an 'A' suffix. In this example, the circuit 800C includes six trenches 802C, 803C-1, 803C-2, 804C-1, 804C-2 and to 805C, and six tethers 807C, 808C-1, 808C-2, 809C-1, 809C-2 and 810C. The table 806C is elongate in the vertical direction, thereby providing additional room for components. As such, in this example the table includes groups of components 801C-1 and 801C-2.

Figure 8D:
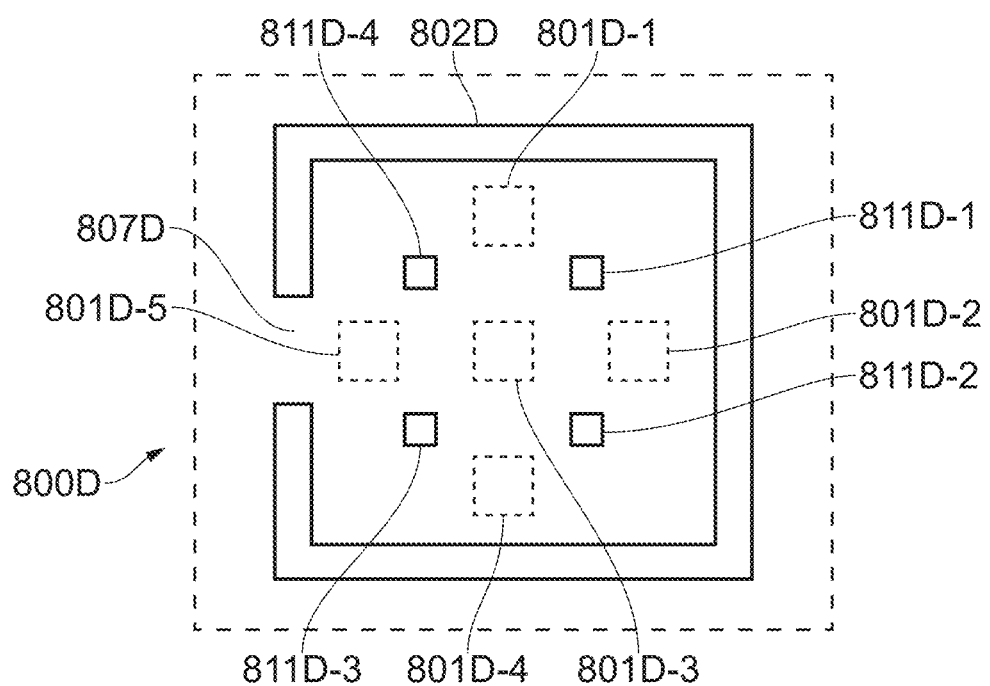

FIG. 8D shows a further example of an integrated circuit 800D. In this example, the table is similar in several respects to the one shown in FIG. 8A. Common components will be denoted with the same reference numeral, will include a 'D' suffix rather than an 'A' suffix. This is example is also similar to FIG. 7, and shows a single tether 807D, and a single trench 802D. The arrangement of components and openings is similar to that shown in FIG. 8B.

Figure 8E:
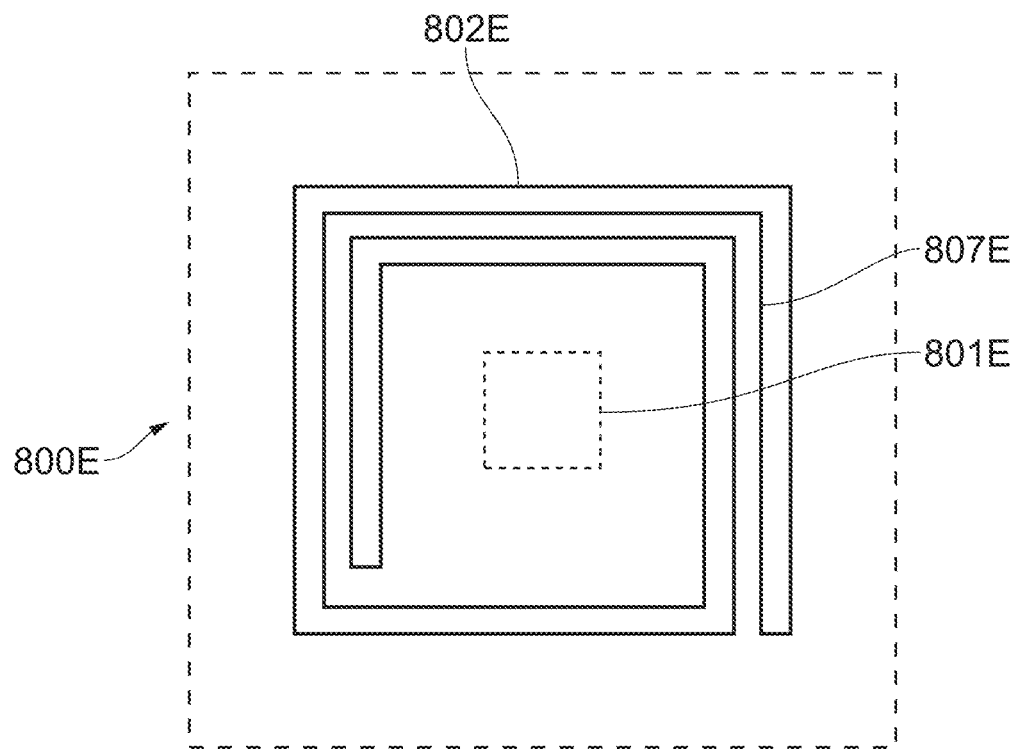
Figure 8F:
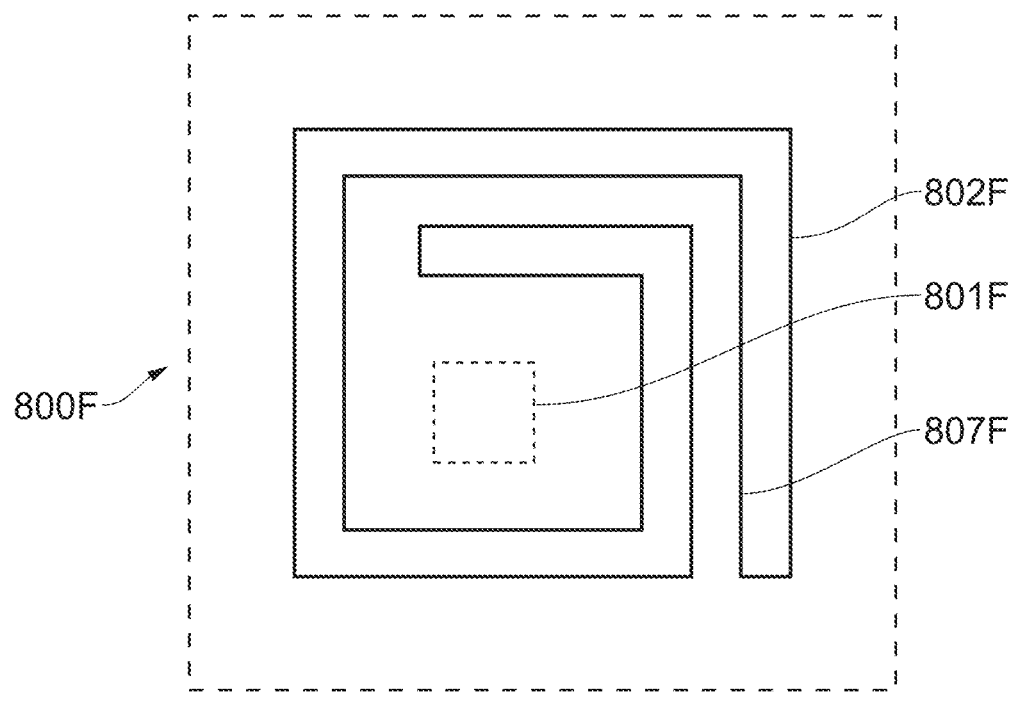

FIGS. 8E and 8F shows two further examples of integrated circuits 800E and 800F. In these examples, the tables are similar in several respects to the one shown in FIG. 8A. Common components will be denoted with the same reference numeral, and will include an 'E' or 'F' suffix rather than an 'A' suffix. These examples show single tether arrangements, in which the tethers form a spiral around the table.

All of the above examples show various arrangements which enable the tables to be isolated from the surrounding structure. The preferred arrangement will vary depending on a number of requirements, such as the circuit components, size restrictions and other design considerations. It will be understood that the disclosure is not limited to any of these arrangements, and other designs are possible within the scope of the claims.

Figure 9:
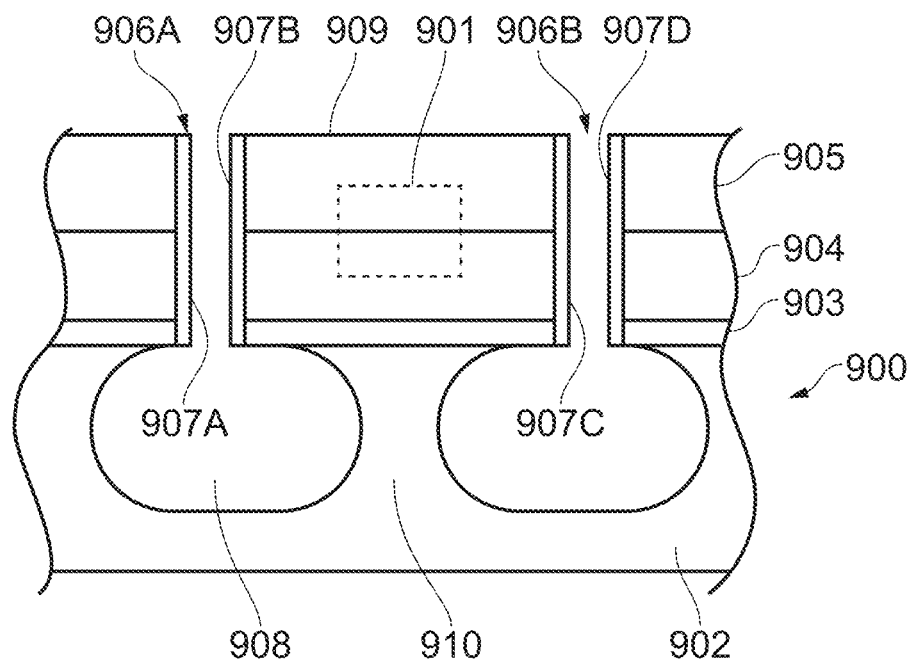
FIG. 9 is a cross-section through an integrated circuit in accordance with an embodiment of the disclosure.

FIG. 9 shows a cross section through an integrated circuit 900 in accordance with a further alternative example of the present disclosure. This example is similar to that shown in FIG. 1, however the cavity does not completely undercut the table. The integrated circuit 900 includes handle silicon 902, oxide layer 903, device silicon layer 904, and upper dielectric layers 905. FIG. 9 also shows two trenches 906A, 906B in a similar manner to those shown in FIG. 1, however in this example the trenches completely surround the table 909 as will be described in more detail below. The trenches are lined with a protective oxide layer 907A to 907D and a trench 908 is formed beneath a table 909. A pedestal 910 is formed underneath the table 909.

Figure 10:
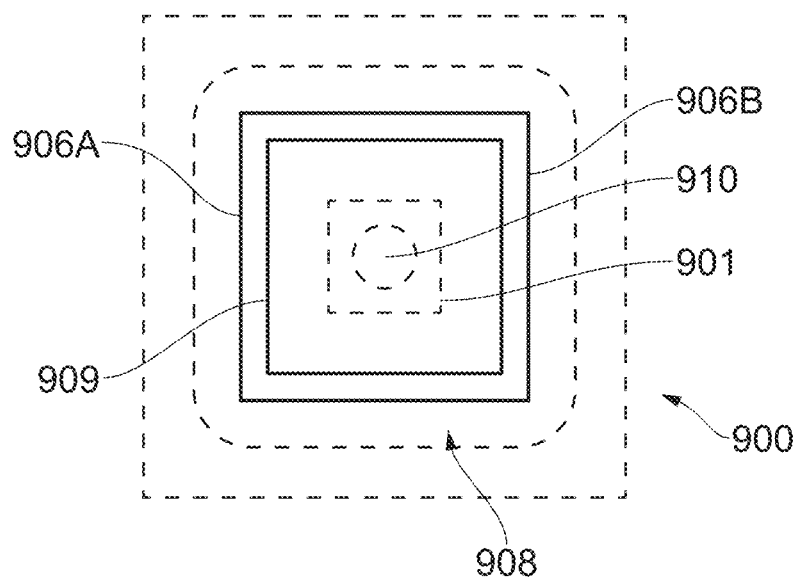
FIG. 10 is a plan view of an integrated circuit in accordance with an embodiment of the disclosure.

FIG. 10 shows a plan view of the integrated circuit 900 of FIG. 9. FIG. 10 shows a single trench which circumscribes the table 909 and comprises the trenches 906A and 906B from FIG. 9. The hashed line at the centre of the table 909 is the pedestal 910 formed by the cavity 908. As can be seen, in this arrangement there are no tethers between the table 909 and the surrounding structure, and the only physical connection between the table and the rest of the structure is the pedestal 910. It will be appreciated that electrical connections needs to be made between the circuits 901 and external connections, and this may be done by bond wires (not shown) which are coupled between connections on the table 909 and connections on the surrounding structure. As an alternative, a physical tether in the structure of the semiconductor may be provided at a single point between the table and the surrounding structure in order to carry the electrical connections. In this regard, a metal bridging structure may also be used.

Figure 11A:
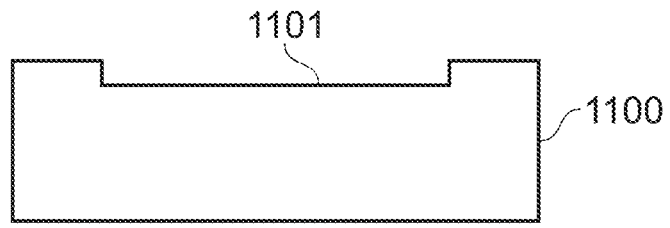
FIGS. 11A to 11C are cross-sections through an integrated circuit of a further embodiment, showing various steps in the manufacturing process.
Figure 11B:
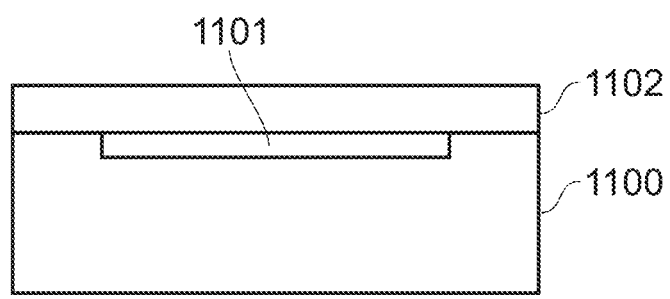
Figure 11C:
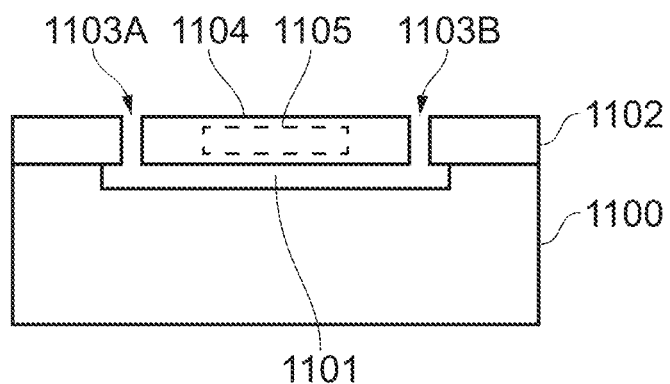

FIGS. 11A to 11C show an alternative method of manufacturing an integrated circuit which includes mechanically isolated components. Rather than using an isotropic etch to create a cavity after trenches have been formed, a wafer is provided with a pre-formed cavity. As shown in FIG. 11A, the first step in the process is to provide a wafer having a recess 1101 formed in its upper surface. A standard circuit wafer including circuit components is then bonded to the upper surface of the wafer 1100. This is shown in FIG. 11B where the circuit wafer 1102 combines with the wafer 1100 to form cavity 1101. Trenches 1103A and 1103B are then formed in the same way as was done for the integrated circuit 100 shown in FIG. 1. As such, a table 1104 comprising circuit components 1105 is formed above the cavity 1101. As with the preceding examples, the arrangement of the trenches and the cavity may take a number of different forms.

Figure 12:
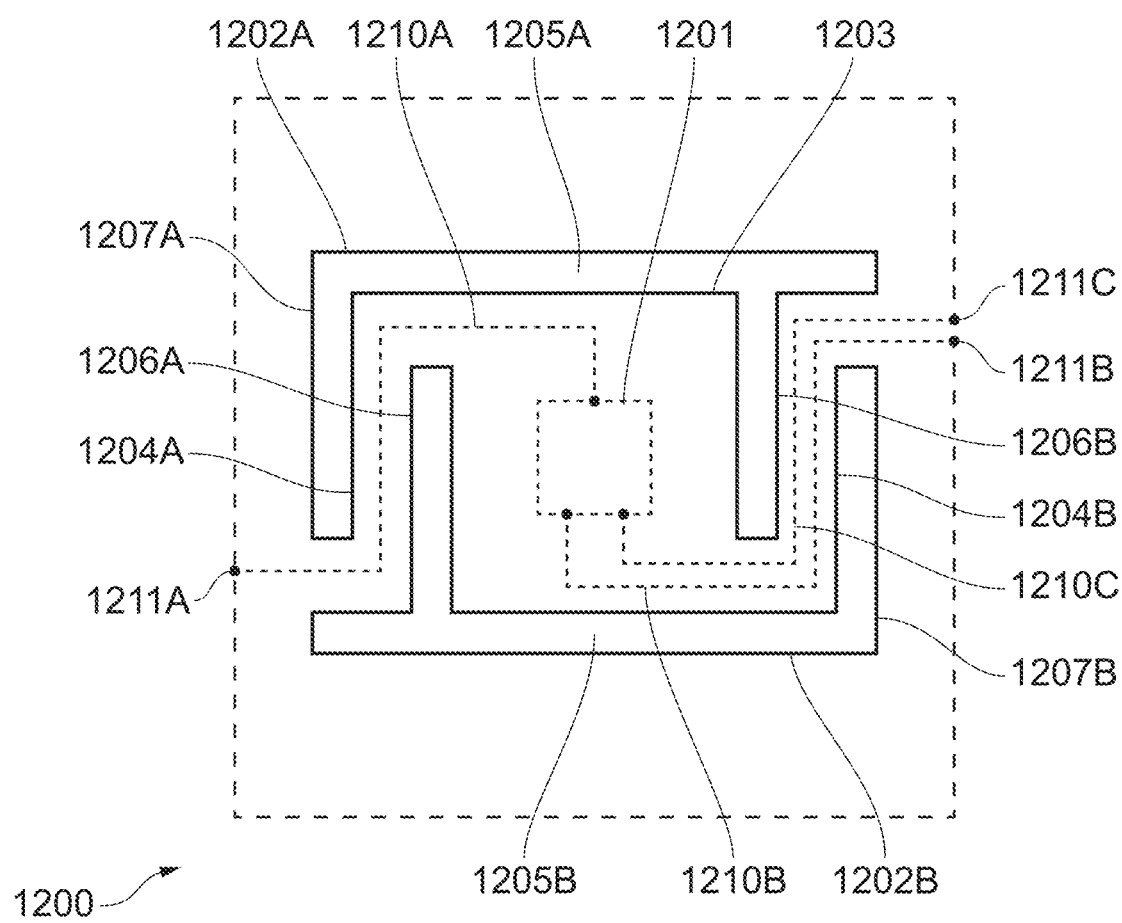
FIG. 12 is a plan view of an integrated circuit in a further embodiment, showing the routings for various conductive tracks.

FIG. 12 shows a further example of an integrated circuit 1200, similar to that shown in FIG. 5. FIG. 12 shows an integrated circuit 1200 which includes circuit components 1201. In this example, two trenches 1202A and 1202B are formed in such a way that table 1203 is coupled to the surrounding structure by two tethers 1204A and 1204B. The tethers are both S-shaped, each coupling a respective corner of the table 1203 to a point on the surrounding structure near an adjacent corner of the table 1203. Each of the trenches includes a first portion 1205A and 1205B which run alongside and define opposing sides of the table 1203. Each trench includes a further portion 1206A, 1206B which run alongside and define orthogonal and opposing sides of the table 1203. The portions 1206A, 1206B are coupled to respective portions 1205A and 1205B such that each trench surrounds two adjoining sides of the table 1203 in an L-shape. Each trench further includes portions 1207A, 1207B which are joined to each respective trench at opposing ends of the portions 1205A, 1205B to the portions 1206A and 1206B. Portions 1207A, 1207B are parallel to sections 1206A, 1206B and orthogonal to sections 1205A and 1205B and further define the S-shape tethers 1204A and 1204B.

In addition, conductive tracks are embedded in the tethers in order to provide external connections for the circuit components 1201. In particular, the circuit includes conductive tracks 1210A, 1210B and 1210C. These tracks may be metalised layers embedded between layers of the substrate and insulating material. Each track makes a connection with an external connection 1211A, 1211B and 1211C.

Figure 13:
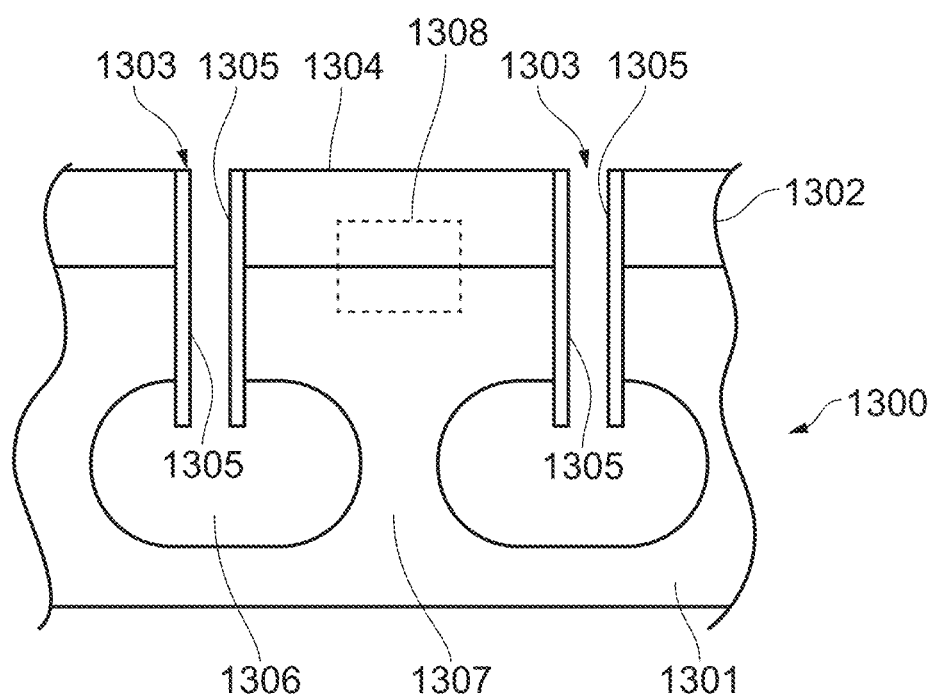
FIG. 13 is a cross-section through an integrated circuit in accordance with an embodiment of the disclosure.

In the above examples, a SOI wafer is used as the starting point for the isolated platform. The present disclosure may also be implemented using non-SOI wafers. FIG. 13 shows a cross section through an integrated circuit 1300 in accordance with a further alternative example of the present disclosure. This example is similar to that shown in FIG. 9, however the silicon substrate is not a silicon on insulator (SOI) wafer. The integrated circuit 1300 includes a silicon substrate 1301, and an upper dielectric layer 1302. FIG. 13 also shows two trenches 1303 in a similar manner to those shown in FIG. 9, completely surrounding a table 1304. The trenches are lined with a protective oxide layer 1305 and a cavity 1306 is formed beneath the table 1304. A pedestal 1307 is formed underneath the table 1304. Integrated circuit components 1308 are formed in an upper portion of the silicon substrate 1301. The non-SOI example is manufactured in a similar manner as the SOI wafer example. However because the trench penetrates the substrate, a timed-etch may be used, rather than using a silicon only or oxide only etch, which penetrates one layer, without penetrating the next layer.

Example Applications

As noted above, the present disclosure may be utilised with any circuit whose parameters may be affected by stress or strain. In particular, circuits which utilise active components, such as transistors, may find particular benefit in utilising the stress-reducing arrangement of the present disclosure. In the following, we have provided examples of circuits that are known by the Applicant to suffer from stress-induced performance issues.

Amplifiers: Amplifier precision may drift in the presence of stress. For example, input stages to precision operational amplifiers are very sensitive to the parameters of the transistors at the input stage. If the parameters of the transistors in the differential input stage differ, owing to stress in the substrate, the overall precision of the amplifier will drift. This may also occur with other amplifier stages.

Reference circuits: Reference circuits may also use differential circuitry, including differential transistor configurations. When stress is applied to differential arrangements, the output of the reference may drift.

Digital-to-Analog Converters (DACs): DACs typically utilise strings of precision resistors. If these resistors are subject to stress, the resistance can change, which can cause a reduction in the precision of the DAC.

Oscillator circuits: Oscillator circuits, such as ring oscillators, use transistors and resistors to generate reference frequencies or reference clocks, in digital, radio frequency and dynamic applications. Stress induced in the transistors or resistors can cause the reference frequency or clock to drift.

In each of the above examples, stress reduction may be used to improve the precision of the circuit. The circuit components 1201 of FIG. 12 may represent the components of any of the above-noted circuits. The present disclosure is applicable to a variety of integrated circuits, particularly those which stress-sensitive active circuit components. Any circuit designed to produce a precision output, using transistors and resistors, may be implemented using the present disclosure, in order to improve accuracy. It will be appreciated that stress may affect the parameters of a wide range of circuits, in addition to those listed above, and that the present disclosure is not limited to any of the examples listed here.

According to an aspect of the present application, an integrated circuit is provided, comprising: an integrated circuit die having one or more stress-sensitive circuits including active circuit components formed on or adjacent to a first surface of the integrated circuit die; one or more trenches formed around the one or more stress-sensitive circuits; and one or more cavities, formed underneath the one or more stress-sensitive circuits. In some embodiments, the one or more cavities are physically coupled to the one or more trenches. In any of the embodiments described above, the one or more cavities may, and in at least some embodiments do, extend underneath the one or more trenches. In any of the embodiments described above, the one or more trenches and the one or more cavities may be, and in at least some embodiments are, configured to form a circuit platform, in the integrated circuit die, the one or more stress-sensitive circuits being formed on the circuit platform. In some embodiments, such as those described above, the one or more trenches and the one or more cavities are configured to form one or more tethers, each tether physically coupling the circuit platform to the surrounding integrated circuit die. In some embodiments, such as those describe above, each tether couples a respective first point on the circuit platform to a respective second point on the surrounding integrated circuit die, the first and second points being at different circumferential locations. In some embodiments, such as those described above, the circuit platform and the surrounding integrated circuit die have a plurality of corners, the corners of the circuit platform aligned with respective corners of the integrated circuit die, and wherein each of the one or more tethers is coupled between a corner of the circuit platform and a corner of the integrated circuit die which is not aligned with the respective corner of the circuit platform. In some embodiments, such as those described above, each tether may, and in some embodiments does, include a major arm member which is arranged to be substantially parallel to a respective side of the circuit platform. In some embodiments, such as those described above, the integrated circuit further comprises one or more conductive tracks, formed along one or more of the tethers, for coupling the one or more stress-sensitive circuits to external connections. In any of the embodiments described above, the one or more trenches may be, and in at least some embodiments are, L-shaped; and a corner of each L-shaped trench is aligned with a corner of the circuit platform. In any of the embodiments described above, a pedestal may be, and in at least some embodiments is, formed underneath the circuit platform, coupling the circuit platform to the integrated circuit die. In any of the embodiments described above, the one or more stress-sensitive circuits may, and in at least some embodiments do, include passive circuit components, and the active or the passive circuit components are stress-sensitive. In any of the embodiments described above, the active circuit components may, and in at least some embodiments do, comprise one or more of: a transistor, a diode, variable capacitor, a varactor, a light-emitting diode, and a thyristor; and the stress-sensitive circuits include one or more of: an amplifier, a reference circuit, an oscillator circuit, or a digital-to-analog converter. In any of the embodiments described above, the one or more stress-sensitive circuits may, and in at least some embodiments do, include two or more transistors arranged in a differential arrangement. In any of the embodiments described above, the integrated circuit may, and in at least some embodiments does, further comprise a microelectromechanical systems (MEMS) cap, formed over the one or more stress-sensitive circuits.

According to an aspect of the present application, a method of manufacturing an integrated circuit is provided, comprising:

providing an integrated circuit die; forming one or more stress-sensitive circuits including active circuit components on or adjacent a first surface of the integrated circuit die; forming one or more trenches around the one or more stress-sensitive circuits; and forming a cavity underneath the one or more stress-sensitive circuits. In some embodiments, the integrated circuit die is made of silicon, and the one or more trenches are formed using a deep silicon etch. In the embodiments described above, the cavity may be, and in at least some embodiments is, formed, via the one or more trenches, using an isotropic etch, and wherein the one or more trenches and the cavity form a platform on which the one or more stress-sensitive circuits are formed.

According to an aspect of the present application, a method of manufacturing an integrated circuit is provided, comprising: providing a wafer having a cavity formed in a first surface thereof; bonding an integrated circuit die to the first surface of the wafer; and forming one or more trenches in a first surface of the integrated circuit die. One or more stress-sensitive circuits including active circuit components are formed on or adjacent the first surface of the integrated circuit die, within a region formed by the one or more trenches. In some embodiments, the one or more trenches extend through the integrated circuit die to the cavity; and the region formed by the one or more trenches is a platform, defined by the one or more trenches and the cavity; and wherein the one or more stress-sensitive circuits are formed on the integrated circuit die prior to bonding to the wafer; or the active circuit components are formed after bonding to the wafer, but prior to forming the one or more trenches.

The terms, "above" and "underneath", have been used above to express the relative orientation of various components in certain figures. It will be understood that these terms are used only to describe orientation with respect to the figures, and in real-world embodiments, the orientations may differ.

The invention claimed is:

1. An integrated circuit, comprising:
an integrated circuit die having one or more stress-sensitive circuits including active circuit components formed on or adjacent to a first surface of the integrated circuit die;
one or more trenches formed around the one or more stress-sensitive circuits; and
one or more cavities, formed underneath the one or more stress-sensitive circuits and having rounded edges.

2. The integrated circuit of claim 1, wherein the one or more cavities are physically coupled to the one or more trenches.

3. The integrated circuit of claim 1, wherein the one or more cavities extend underneath the one or more trenches.

4. The integrated circuit of claim 1, wherein the one or more trenches and the one or more cavities are configured to form a circuit platform, in the integrated circuit die, the one or more stress-sensitive circuits being formed on the circuit platform.

5. The integrated circuit of claim 4, wherein the one or more trenches and the one or more cavities are configured to form one or more tethers, each tether physically coupling the circuit platform to the surrounding integrated circuit die.

6. The integrated circuit of claim 5, wherein each tether couples a respective first point on the circuit platform to a respective second point on the surrounding integrated circuit die, the first and second points being at different circumferential locations.

7. The integrated circuit of claim 6, wherein the circuit platform and the surrounding integrated circuit die have a plurality of corners, the corners of the circuit platform aligned with respective corners of the integrated circuit die, and wherein each of the one or more tethers is coupled between a corner of the circuit platform and a corner of the integrated circuit die which is not aligned with the respective corner of the circuit platform.

8. The integrated circuit of claim 7, wherein each tether includes a portion which is arranged to be substantially parallel to a respective side of the circuit platform.

9. The integrated circuit of claim 5, further comprising one or more conductive tracks, formed along one or more of the tethers, for coupling the one or more stress-sensitive circuits to external connections.

10. The integrated circuit of claim 4, wherein the one or more trenches are L-shaped; and a corner of each L-shaped trench is aligned with a corner of the circuit platform.

11. The integrated circuit of claim 4, wherein a pedestal is formed underneath the circuit platform, coupling the circuit platform to the integrated circuit die.

12. The integrated circuit of claim 1, wherein the one or more stress-sensitive circuits include passive circuit components, and the active or the passive circuit components are stress-sensitive.

13. An integrated circuit, comprising:
an integrated circuit die having an active circuit component;
a trench formed through a portion of the integrated circuit die adjacent the active circuit component; and
a cavity formed in the integrated circuit die underneath at least a portion of the active circuit component, wherein the cavity includes rounded edges.

14. The integrated circuit of claim 13, wherein the cavity is physically coupled to the trench.

15. The integrated circuit of claim 13, wherein the trench separates the active circuit component from a neighboring area of the integrated circuit die, wherein the integrated circuit further comprises a tether physically coupling the neighboring area of the integrated circuit die to the active circuit component.

16. The integrated circuit of claim 13, further comprising a pedestal formed on the integrated circuit die and supporting the active integrated circuit, wherein the pedestal extends through the cavity.

17. The integrated circuit of claim 1, wherein the one or more trenches are lined with sidewall protection.

18. The integrated circuit of claim 13, wherein the trench is lined with sidewall protection.

* * * * *